United States Patent
Teng

[19]

[11] Patent Number: 5,886,886
[45] Date of Patent: Mar. 23, 1999

[54] VOLTAGE MULTIPLIER FOR A POWER SUPPLY UNIT OF AN ELECTRONIC INSECT-KILLER DEVICE

[76] Inventor: Shie-Ning Teng, No. 53, An Le Rd., Ling Ya Dist., Kaohsiung, Taiwan

[21] Appl. No.: 915,177

[22] Filed: Aug. 20, 1997

[51] Int. Cl.$^6$ .............................. H02M 7/24; A01M 3/02
[52] U.S. Cl. .............................................. 363/59; 361/749
[58] Field of Search ................................. 363/59, 60, 61, 363/16; 361/749

[56] References Cited

U.S. PATENT DOCUMENTS

| 3,900,788 | 8/1975 | Behn et al. | 363/59 |
| 5,519,963 | 5/1996 | Shih | 43/137 |

OTHER PUBLICATIONS

IBM Technical Disclosure Bulletin vol. 28 No. 1 Jun. 1985.

*Primary Examiner*—Peter S. Wong
*Assistant Examiner*—Rajnikant B. Patel
*Attorney, Agent, or Firm*—Michael A. O'Neil

[57] ABSTRACT

A voltage multiplier for a power supply unit of an electronic insect-killing device includes a circuit board received in the electronic insect-killing device. A central line of the circuit board is formed as a score therein to allow the circuit board to be folded therealong. A plurality of copper foil circuits are respectively disposed on two sides of the central line of the circuit board. A voltage multiplier formed of electric elements is connected to the plurality of copper foil circuits. In this way, the power supply unit including the voltage multiplier has a sufficiently small volume to be received in a handle of the electronic insect-killing device and assures secure wiring.

2 Claims, 4 Drawing Sheets

VOLTAGE MULTIPLIER FOR A POWER SUPPLY UNIT OF AN ELECTRONIC INSECT-KILLER DEVICE

BACKGROUND OF THE INVENTION

1. Field of the Invention

The present invention relates to a power supply unit of an electronic insect-killing device, and more particularly to a voltage multiplier for the supply unit which is foldable and assures secure wiring of the electronic insect-killing device.

2. Description of Related Art

Conventional insect-killing devices include various kinds, such as an electronic fly-swatter, a fly-adhering paper, an electronic insect-killing light, and so on. A principle of the electronic fly-swatter is to kill the flies by electrified wire netting. A conventional power supply unit of a fly-swatter generally has dry batteries and a booster to assure the voltage is high enough to kill the insects. A circuit principle of the electrified wire netting is that a voltage output by the battery is multiplied by a voltage multiplier having an output terminal thereof connected to a metal grid. A circuit diagram of the voltage multiplier is shown in FIG. 5. It can be seen from the figure that a voltage circuit of the voltage multiplier is composed of a plurality of diodes and capacitors. To receive the plurality of diodes and capacitors in a handle of the fly-swatter, the wiring manner involved is to directly weld pins of each of the diodes and capacitors. This wiring manner has an obvious disadvantage that it results in unstable wiring and thus may cause defective contacts, or even a short circuit. Additionally, this wiring manner takes a long time during manufacturing so that it is not adapted for mass production.

The present invention provides an improved voltage multiplier for a power supply unit of an electronic insect-killing device to mitigate and/or obviate the aforementioned problems.

SUMMARY OF THE INVENTION

One object of the present invention is to provide a voltage multiplier for a power supply unit of an electronic insect-killing device, which can be folded and assures secure wiring of the electronic insect-killing device.

In accordance with one aspect of the present invention, the voltage multiplier for the power supply unit of the electronic insect-killing device includes a circuit board received in the electronic insect-killing device. The circuit board is foldable along a central line thereof. A plurality of copper foil circuits are respectively disposed on two sides of the central line of the circuit board. A voltage multiplying circuit formed of electric elements is connected to the plurality of copper foil circuits.

In accordance with another aspect of the present invention, the central line of the circuit board of the voltage multiplier is formed as a score therein.

In accordance with a further aspect of the present invention, the central line of the circuit board of the voltage multiplier has a sequence of perforations defined therein.

Other objects, advantages and novel features of the invention will become more apparent from the following detailed description when taken in conjunction with the accompanying drawings.

DETAILED DESCRIPTION OF PREFERRED EMBODIMENT

Figure 1:
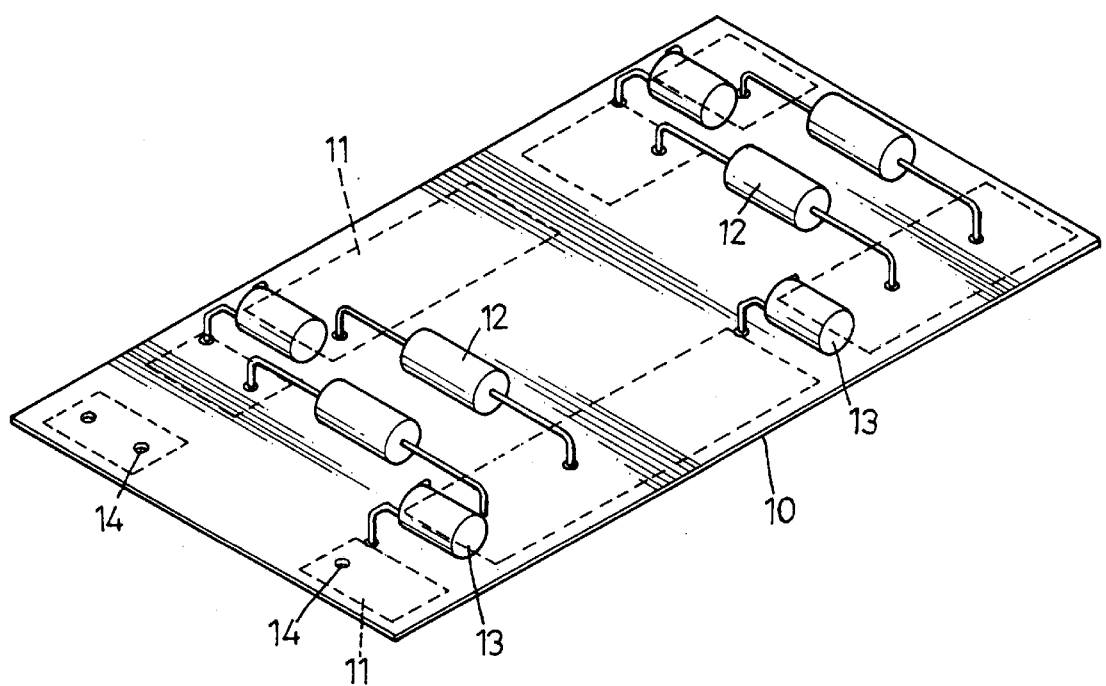
FIG. 1 is a perspective view showing a voltage multiplier for a power supply unit of an electronic insect-killing device in accordance with a first embodiment of the present invention.
Figure 4:
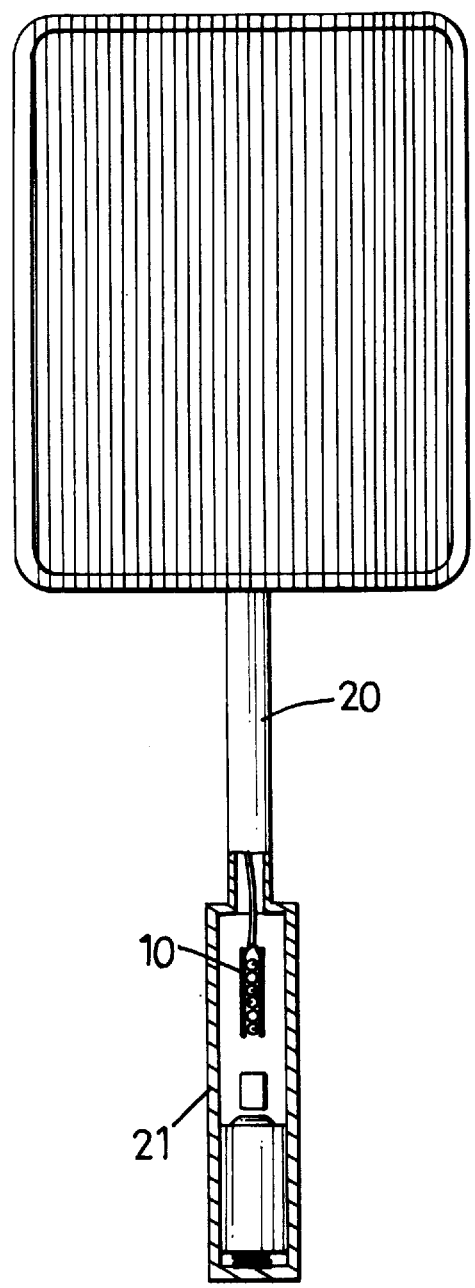
FIG. 4 is a schematic view showing application of the voltage multiplier of FIG. 2 in an electronic insect-killing device.

Referring to figures and FIGS. 1 and 4 in particular, a voltage multiplier for a power supply unit of an electronic insect-killing device 20 in accordance with a first embodiment of the present invention includes a printed circuit board 10. The printed circuit board 10 is configured sufficiently small so that it can be received in a handle 21 of the electronic insect-killing device 20. A plurality of copper foil circuits 11 are respectively formed on a surface of the printed circuit board 10 by electrodeposition. The copper foil circuits 11 are configured to mate with a voltage multiplying circuit (not numbered) used in the electronic insect-killing device 20. The voltage multiplying circuit is formed of a plurality of diodes 12 and a plurality of capacitors 13 connected in series or in parallel. To electrically connect the diodes 12 and capacitors 13 to the circuit board 10, a corresponding number of through holes 14 are defined in each copper foil circuit 11 for allowing pins of the diodes 12 and capacitors 13 to extend therethrough and then be welded on the copper foil circuits 11. Since each electric element (the diodes 12 and the capacitors 13) of the voltage multiplying circuit is secured on the printed circuit board 10 of the electronic insect-killing device 20, secure wiring can be assured and defective electrical contacts and short circuits can be avoided.

Figure 2:
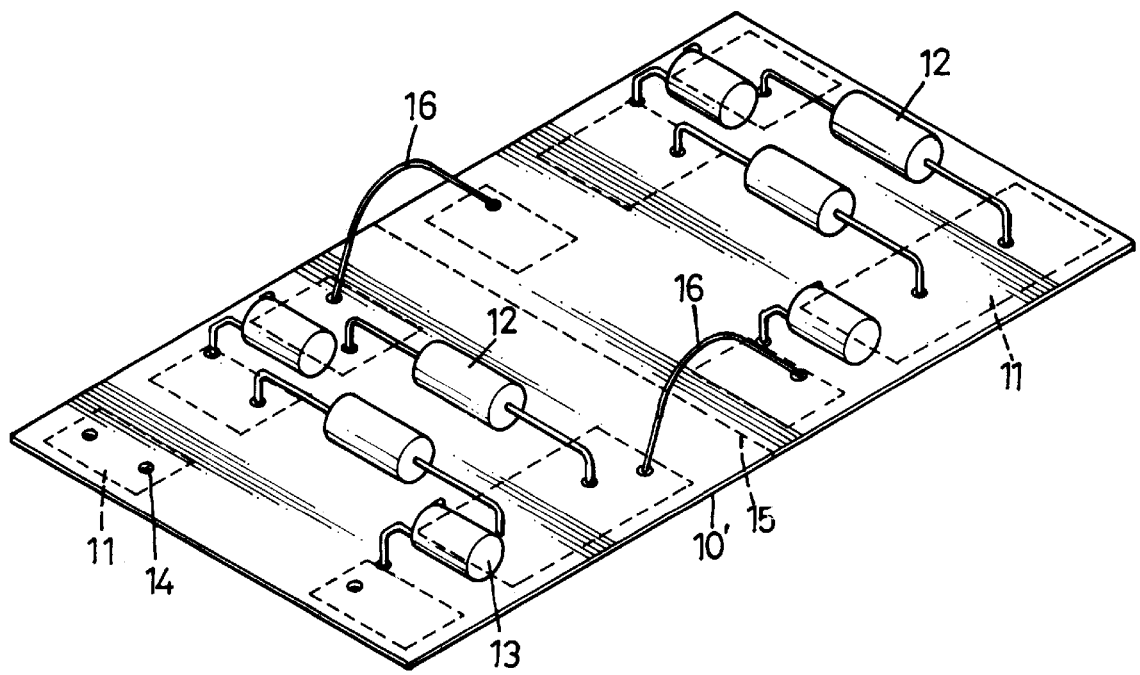
FIG. 2 is a perspective view showing a voltage multiplier for a power supply unit of an electronic insect-killing device in accordance with a second embodiment of the present invention.
Figure 3:
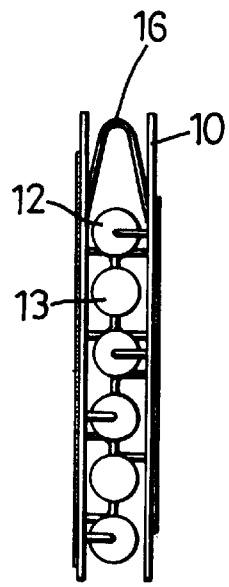
FIG. 3 is a plane view showing that the voltage multiplier of an electronic insect-killing device of FIG. 2 is in a folded state.
Figure 5:
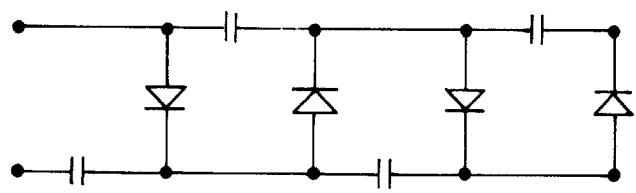
FIG. 5 is a circuit diagram of a convention voltage multiplier of an electronic insect-killing device.

To further reduce the volume of the voltage multiplier of the electronic insect-killing device 20, a second embodiment is adopted. Referring to FIG. 2, the voltage multiplier in accordance with the second embodiment of the present invention also has a circuit board 10'. A difference between the first embodiment and the second embodiment is that the circuit board 10'is foldable along a central line (not numbered) thereof. In the second embodiment, the plurality of copper foil circuits 11 are respectively disposed on two sides of the central line of the circuit board 10'. The diodes 12 and the capacitors 13 are respectively connected to a corresponding copper foil circuit 11 and form a voltage multiplying circuit. The copper foil circuits 11 at both of two sides of the circuit board 10' are electrically connected by bridging lines 16. Additionally, the central line of the circuit board 10' is formed as a score 15 therein such that the circuit board 10' can be folded as shown in FIG. 3. In this way, the power supply unit may have a length one half of an original length thereof. Though a thickness of the voltage multiplier may be relatively increased, a total volume thereof still smaller than that of the first embodiment. In an alternative embodiment, the central line of the circuit board 10' may have a sequence of perforations substituting the score 15.

Accordingly, the voltage multiplier in accordance with the present invention has a sufficiently small volume to be received in the handle 21 of the electronic insect-killing device 20 and assures secure wiring.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A voltage multiplier for a power supply unit of an electronic insect-killing device comprising:

a circuit board being foldable along a central line thereof wherein the central line is formed as a score in the circuit board;

a plurality of copper foil circuits respectively disposed on both sides of the central line of the circuit board;

a plurality of bridging lines for electrically connecting the plurality of copper circuits over the center line; and a voltage multiplying circuit having a plurality of electronic elements connected to the plurality of copper foil circuits.

2. A voltage multiplier for a power supply unit of an electronic insect-killing device comprising:

a circuit board being foldable along a central line thereof wherein the central line has a sequence of perforations defined in the circuit board;

a plurality of copper foil circuits respectively disposed on both sides of the central line of the circuit board;

a plurality of bridging lines for electrically connecting the plurality of copper circuits over the center line; and a voltage multiplying circuit having a plurality of electronic elements connected to the plurality of copper foil circuits.

\* \* \* \* \*